(12) United States Patent
Kuttenkuler et al.

(10) Patent No.: US 11,569,647 B2
(45) Date of Patent: Jan. 31, 2023

(54) ELECTRICAL SYSTEM FOR BUS BAR COUPLING

(71) Applicant: Transportation IP Holdings, LLC, Norwalk, CT (US)

(72) Inventors: Jason Kuttenkuler, Erie, PA (US); Henry Todd Young, Erie, PA (US); Mark Murphy, Erie, PA (US); Jacob Hubbell, Erie, PA (US); Theodore Brown, Erie, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 0 days.

(21) Appl. No.: 17/209,618

(22) Filed: Mar. 23, 2021

(65) Prior Publication Data
US 2021/0296877 A1 Sep. 23, 2021

Related U.S. Application Data

(60) Provisional application No. 62/993,226, filed on Mar. 23, 2020.

(51) Int. Cl.
*H02G 5/02* (2006.01)
*H05K 7/20* (2006.01)
*H05K 1/18* (2006.01)

(52) U.S. Cl.
CPC ............... *H02G 5/025* (2013.01); *H05K 1/18* (2013.01); *H05K 7/2039* (2013.01); *H05K 2201/10166* (2013.01); *H05K 2201/10272* (2013.01)

(58) Field of Classification Search
CPC .......... H02G 5/025; H05K 1/18; H05K 1/181; H05K 7/2039; H05K 2201/10166; H05K 2201/10272
See application file for complete search history.

(56) References Cited

U.S. PATENT DOCUMENTS

| | | | | |
|---|---|---|---|---|
| 2,985,710 A | * | 5/1961 | Davis | H02G 5/025 439/212 |
| 3,245,031 A | * | 4/1966 | Barney | H01R 25/142 439/861 |
| 3,612,745 A | * | 10/1971 | Warren | H05K 1/0271 174/268 |

(Continued)

FOREIGN PATENT DOCUMENTS

| | | |
|---|---|---|
| CN | 102770985 A | 11/2012 |
| CN | 204633517 A | 9/2015 |
| DE | 102014201191 A1 | 7/2015 |

OTHER PUBLICATIONS

Search Report dated Aug. 25, 2021 for corresponding Application No. GB2103941.7 (6 pages).

(Continued)

*Primary Examiner* — Adam B Dravininkas
(74) *Attorney, Agent, or Firm* — The Small Patent Law Group LLC; Josef L. Hoffmann

(57) ABSTRACT

A system that may include a rigid bus bar body portion having one or more first conductive pathways, and a flexible bus bar body portion extending from the rigid bus bar body portion and having a lower modulus of elasticity than the rigid bus bar body portion, the flexible bus bar body portion including one or more second conductive pathways. The one or more first conductive pathways and the one or more second conductive pathways may be configured to be conductively coupled with a first electronic device to form a conductive connection between the first electronic device and at least a second electronic device.

20 Claims, 7 Drawing Sheets

(56) References Cited

U.S. PATENT DOCUMENTS

| | | | | |
|---|---|---|---|---|
| 3,708,610 A | * | 1/1973 | Kozel | H05K 1/0263 |
| | | | | 174/117 FF |
| 4,109,768 A | * | 8/1978 | Fromme | B60M 1/30 |
| | | | | 191/32 |
| 4,845,592 A | * | 7/1989 | Himes, Jr. | H02G 5/005 |
| | | | | 361/776 |
| 5,049,090 A | * | 9/1991 | Johnson | H01R 12/62 |
| | | | | 439/493 |
| 5,363,552 A | * | 11/1994 | Coniff | H01L 23/4093 |
| | | | | 29/874 |
| 10,477,717 B2 | | 11/2019 | Hasija et al. | |
| 10,505,304 B2 | | 12/2019 | Shing | |
| 2012/0088143 A1 | | 2/2012 | Lietz et al. | |
| 2013/0105218 A1 | | 5/2013 | Kuboshima et al. | |
| 2014/0360749 A1 | * | 12/2014 | Gao | H05K 3/325 |
| | | | | 439/828 |
| 2015/0136476 A1 | * | 5/2015 | Lumetta | H01R 12/57 |
| | | | | 174/70 B |
| 2015/0313002 A1 | * | 10/2015 | Krivonak | H01G 2/02 |
| | | | | 174/254 |
| 2018/0375240 A1 | | 12/2018 | Shing | |
| 2019/0104634 A1 | | 4/2019 | Hasija et al. | |
| 2020/0036137 A1 | * | 1/2020 | Habeb | H01R 4/30 |
| 2020/0274307 A1 | * | 8/2020 | Young | H01L 23/492 |
| 2020/0396830 A1 | * | 12/2020 | Yasuda | H01M 10/4207 |

OTHER PUBLICATIONS

First Examination Report received for related Indian Patent Application No. 202114010791 dated Jul. 6, 2022 (5 pages).

* cited by examiner

US 11,569,647 B2

ELECTRICAL SYSTEM FOR BUS BAR COUPLING

CROSS-REFERENCE TO RELATED APPLICATIONS

This application claims priority to U.S. Provisional Application No. 62/993,226, which was filed on 23 Mar. 2020, and the entire disclosure of which is incorporated herein by reference.

BACKGROUND

Technical Field

Embodiments of the subject matter described herein relate to bus bars.

Discussion of Art

Bus bars are electrical apparatuses that form conductive pathways to couple electrical devices. Bus bars are often formed as metallic strips, or bars, and are located within a panel board for high current power distribution. Though, in some applications, bus bars may be used in association with low voltage electrical device within battery banks.

As technology within electrical devices continues to advance, electrical devices tend to become smaller and smaller. The miniaturization of electrical components comes with mechanical design constraints. In particular, as electrical components become smaller, and less space is allotted within an electrical device, electrical component tolerances are significantly reduced. When electrical components, including bus bars, are not sized correctly, shortages, electrical creep, etc. may occur substantially impacting performance of the electrical component and electrical device.

Still, simple solutions to bus bar sizing and tolerance are difficult to determine. In particular, adjusting manufacturing methods can be expensive. Meanwhile, for every mechanical adjustment made, electrical properties, including induction, electrical flux, current flow, etc. must be considered to ensure that the performance of the electrical device is not compromised to provide mechanical based solutions. As an example, the material selected for the bus bar must be able to pass high-voltage potential testing (hi-pot testing). Thus, a simple material change, or size adjustment is similarly insufficient.

BRIEF DESCRIPTION

In accordance with one embodiment, a system may be provided that may include a rigid bus bar body portion having one or more first conductive pathways, and a flexible bus bar body portion extending from the rigid bus bar body portion and having a lower modulus of elasticity than the rigid bus bar body portion. The flexible bus bar body portion may also include one or more second conductive pathways. The one or more first conductive pathways and the one or more second conductive pathways may be configured to be conductively coupled with a first electronic device to form a conductive connection between the first electronic device and at least a second electronic device.

In accordance with one embodiment, a system may be provided that may include a first rigid bus bar body portion, a first flexible bus bar body portion extending from the first rigid bus bar body portion and having a lower modulus of elasticity than the first rigid bus bar body portion, and a second rigid bus bar body portion mechanically coupled to the first rigid bus bar body portion. The system may also include a second flexible bus bar body portion extending from the second rigid bus bar body portion and having a lower modulus of elasticity than the second rigid bus bar body portion.

In accordance with one embodiment, a system may be provided that may include a rigid bus bar body portion, and at least one flexible bus bar body portion extending from the rigid bus bar body portion and having a lower modulus of elasticity than the rigid bus bar body portion. The system may also include an insulated-gate bipolar transistor mechanically coupled to the rigid bus bar body portion when coupled to the at least one flexible bus bar body portion to provide a conductive pathway between the insulated-gate bipolar transistor and the rigid bus bar body portion.

BRIEF DESCRIPTION OF THE DRAWINGS

The inventive subject matter may be understood from reading the following description of non-limiting embodiments, with reference to the attached drawings, wherein below.

DETAILED DESCRIPTION

Embodiments of the subject matter described herein relate to forming a bus bar with flexible bus bar connectors within a rigid bus bar body portion so that when tolerances between the bus bar and an electrical device such at an insulated-gate bipolar transistor (IGBT) are not compatible, the flexible bus bar connectors flex to accommodate the differences. The flexible bus bar connectors may be flexible bus bar body portions that may extend within a rigid bus bar body portion. The flexible bus bar connectors may be flexible as a result of providing a thinner thickness than the rigid bus bar body portion, by providing a different material, by using a manufacturing process such as brazing, or the like. In an example, plural bus bar rigid body portions may be stacked on top of one another with only one of the layers including the flexible bus bar body portion, making the flexible bus bar body portion the thickness of that specific layer. Still, in each instance, only the portion that makes the connection with the electrical device is flexible. By having flexible connectors with a rigid body, the bus bar can pass required testing such as high-power potential testing (hi-pot testing), and provide the structural integrity as required, but still present tolerance relief. A bus bar may include plural flexible bus bar body portions that may be aligned, spaced in parallel to one another, orthogonal to one another, etc. In particular, both mechanical properties and electrical properties may be considered in making determinations associated with the orientation and positioning of the plural flexible bus bar body portions to one another.

Figure 1:
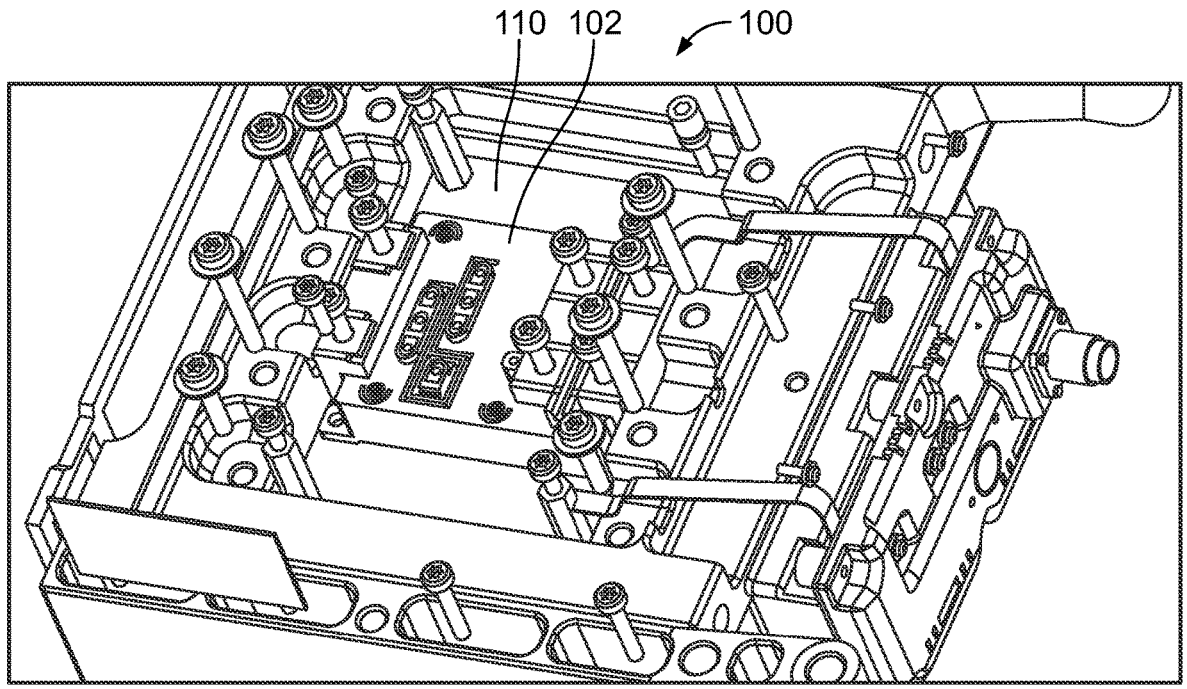
FIG. 1 illustrates a top perspective view of an electrical system.
Figure 2:
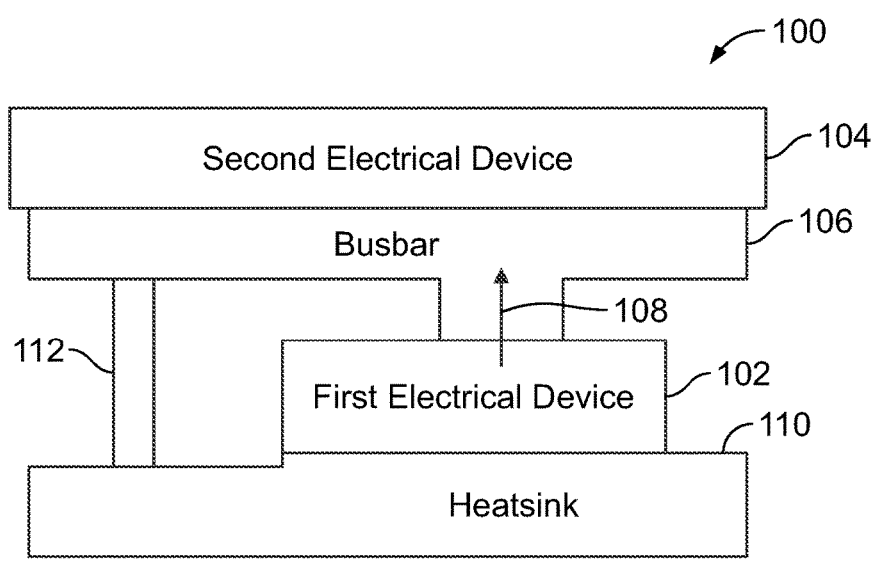
FIG. 2 illustrates a side schematic view of an electrical system of FIG. 1.

FIGS. 1 and 2 illustrate an electrical system 100, with FIG. 2 being a side schematic drawing of the electrical system 100 of FIG. 1. The electrical system includes a first electrical device 102, that is coupled to a second electrical device 104 with a bus bar 106. The first electrical device in one example is an IGBT. The second electrical device may be a motor, battery, transformer, etc. In one example, the bus bar may be configured to receive direct current (DC). The bus bar may couple the first electrical device and second electrical device to provide at least one conductive pathway 108 between the first electrical device and second electrical device. In other example embodiments, additional conductive pathways are provided through the bus bar depending upon the connection points between the bus bar, the first electrical device and second electrical device. In one example, a heat sink 110 may be coupled to the first electrical device to convey heat from the first electrical device to the heat sink. The heat sink in one example may be an elongated metal plate that extends along the first electrical device to convey heat from the electrical device. The electrical system may include fastening elements 112 to secure the bus bar to the heat sink to sandwich or compress the first electrical device between the bus bar and the heat sink.

Figure 3:
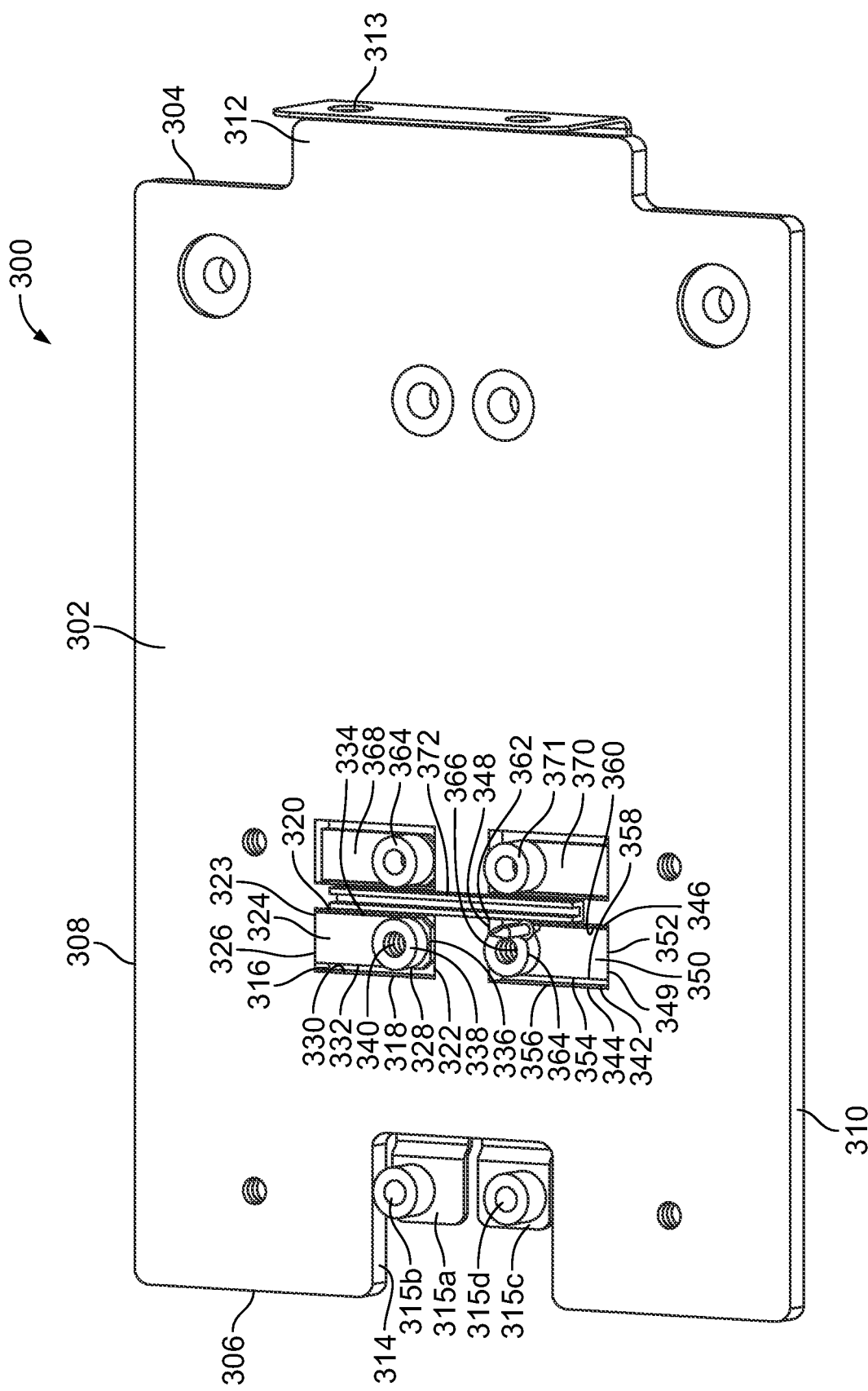
FIG. 3 illustrates a perspective view of a bus bar.

FIG. 3 illustrates an example bus bar 300. In one example, the bus bar of FIG. 3 is the bus bar as illustrated in FIGS. 1 and 2. The bus bar includes a rigid bus bar body portion 302 that in an example may be generally rectangular having a front edge 304, back edge 306, a first side edge 308, and a second side edge 310. At the front edge a first coupling member 312 extends outwardly and transverse to the rigid bus bar body portion and includes terminals 313. In one example the terminals may be configured to couple to a drain of an IGBT. Meanwhile, at the back edge a coupling notch 314 is provided. The coupling notch includes a first flexible tab 315a having a first terminal 315b in side-by-side spaced relation with a second flexible tab 315c having a second terminal 315d for coupling to an electronic device. In one example, each terminal may receive and electrically couple to a source of an IGBT. The first flexible tab and second flexible tab may be phase terminals. The first flexible tab and second flexible tab may each be coupled through brazing. In one example, the first flexible tab and second flexible tab may have a modulus of elasticity that is lower than modulus of elasticity of the rigid bus bar body portion.

The modulus of elasticity can represent a measure of stress divided by strain, where stress is the force causing a deformation and strain is a rate of change of a deformation caused by the stress. Example elastic moduli may include Young's modulus, or tensile elasticity, that measures the deformation of an object along an axis as a result of opposing forces. Young's modulus may be a measure of tensile stress divided by tensile strain. Another example elastic moduli may be the modulus of rigidity, or shear modulus, that measures the deformation of a shape at a constant volume when acted upon by opposing forces. The modulus of rigidity may be measured as a shear stress over a shear strain. Yet another example moduli may be a bulk modulus that measures deformation in all or multiple directions when uniformly loaded in all or multiple directions. The bulk modulus may also be measured as a volumetric stress divided by a volumetric strain, or considered as Young's modulus in three-dimensions. Other example moduli may include Poisson's ratio, Lame's first parameter, the P-wave modulus, etc., all that measure a stress divided by a strain of a material.

In one example, the spring constant, or Young's modulus of elasticity under Hooke's law, of the first flexible tab is 110 MPa, or $1.6*10^4$ lbs/in$^2$. Comparatively, previous bus bar body portions that are not considered flexible have a modulus of elasticity of approximately 1650 MPa, or $2.4*10^5$ lbs/in$^2$. In another example, the rigid bus bar body portion has a modulus of elasticity of greater than 1380 MPa, or $2.0*10^5$ lbs/in$^2$. In another example the modulus of elasticity of the first flexible tab is less than 345 MPa, or $5*10^4$ lbs/in$^2$. In yet another example the modulus of elasticity of the first flexible tab is at least ten times less than the modulus of elasticity of the rigid bus bar body portion. In yet another example, the modulus of elasticity of the first flexible tab is in a range between 70 MPa, or $1*10^4$ lbs/in$^2$ and 345 MPa, or $5*10^4$ lbs/in$^2$. For each example, the second flexible tab may have similar modulus of elasticity as described in relation to the first modulus of elasticity.

When discussing the modulus of elasticity of the first flexible tab second flexible tab in relation to the rigid bus bar body portion, in some instances the average modulus of elasticity over the entire first flexible tab and second flexible tab may be lower than the average modulus of elasticity over the entire rigid bus bar body portion. In other examples, just a section of the first flexible tab and second flexible tab may have a modulus of elasticity that is lower than a section of the rigid bus bar body portion.

In one example, the first flexible tab and second flexible tab may each have a thickness that is less than, or thinner than, a thickness of the rigid bus bar body portion. Specifically, the rigid bus bar body portion may have a thickness in a range between 1.5 mm and 2.5 mm, whereas the first flexible tab and/or second flexible tab may have a thickness in a range between 0.5 mm and 1.5 mm. In one example, the rigid bus bar body portion may have a thickness of 2 mm, whereas the first flexible tab and or second flexible tab may have a thickness of 1 mm. As a result of the reduced thickness of the material, the modulus of elasticity of the first flexible tab and/or second flexible tab may be lower than the rigid bus bar body portion. In such an example, the first flexible tab, second flexible tab, and rigid bus bar body portion may be of one piece construction, and/or made during the same manufacturing process. The manufacturing process may be an additive process including through 3D printing, or may be a subtractive process such as use of a mold. Alternatively, the rigid bus bar body portion may be comprised of two or more layers and the flexible tabs may be only on a single layer to provide the different in thickness of the tab compared to the rigid bus bar body portion. In one example, six layers may be provided with one or more layers providing the thickness of the first flexible tab or second flexible tab.

In another example, the material of the first flexible tab and/or second flexible tab may be different than the material of the rigid bus bar body portion. Specifically, the material of the first flexible tab and/or second flexible tab may be that same thickness of the rigid bus bar body portion, only a different material to change the modulus of elasticity. In one example, the material of the first flexible tab and or second flexible tab may be doped to change the modulus of elasticity compared to the rigid bus bar body portion. In one example, the first flexible tab and/or second flexible tab may be formed of a braided metal, or other flexible conductive material.

In yet another example, the interface between the rigid bus bar body section and first flexible bus bar body portion may be manufactured to provide the difference in the modulus of elasticity, including through brazing to form a brazed connection section. To this end, the interface, or joint between the rigid bus bar body portion and first flexible bus bar body portion is considered part of the first flexible bus bar body portion and may have the only section of material with a low modulus of elasticity compared to the section of the rigid bus bar body portion adjoining the interface. In other examples, the first flexible bus bar body portion may include an undulate design that may also improve thermal cycling characteristics.

The rigid bus bar body portion may also include a first body opening 316. The first opening is generally rectangular in shape and has a perimeter that includes a first side edge 318 facing and in parallel spaced relation to a second side edge 320. Each of the first side edge and second side edge terminate in a third side edge 322 that extends transverse of the first side edge and second side edge. Opposite of the third side edge is a fourth side edge 323 that is parallel to the third side edge.

A first flexible bus bar body portion 324 extends from the fourth side edge within the first opening. In one example, the first flexible bus bar body portion is configured to couple to a gate of an IGBT. In one example, the first flexible bus bar body portion may extend from an interface 326 with the rigid bus bar body portion at the fourth side edge into the first opening. In one example, the interface may be the only section of the first flexible bus bar body portion coupled with the rigid bus bar body portion. Alternatively, the rigid bus bar body may comprise a first layer having a first thickness and a second layer having a second thickness, and the first flexible bus bar body portion is only provided on one layer.

In one example, the spring constant, or Young's modulus of elasticity under Hooke's law, of the first flexible bus bar body portion is 110 MPa, or $1.6*10^4$ lbs/in$^2$. Comparatively, previous bus bar body portions that are not considered flexible have a modulus of elasticity of approximately 1650 MPa, or $2.4*10^5$ lbs/in$^2$. In another example, the rigid bus bar body portion has a modulus of elasticity of greater than 1380 MPa, or $2.0*10^5$ lbs/$^2$. In another example the modulus of elasticity of the first flexible bus bar body portion is less than 345 MPa, or $5*10^4$ lbs/in$^2$. In yet another example the modulus of elasticity of the flexible bus bar body portion is at least ten times less than the modulus of elasticity of the rigid bus bar body portion. In yet another example, the modulus of elasticity of the flexible bus bar boy portion is in a range between 70 MPa, or $1*10^4$ lbs/$^2$ and 345 MPa, or $5*10^4$ lbs/in$^2$.

A gap 328 may extend around the periphery 330 of the first flexible bus bar body portion to space the first flexible bus bar body portion from the rigid bus bar body portion. The first flexible bus bar body portion has a modulus of elasticity that is lower than modulus of elasticity of the rigid bus bar body portion. When discussing the modulus of elasticity of the first flexible body portion in relation to the rigid bus bar body portion, while in some instances the average modulus of elasticity over the entire first flexible body portion will be lower than the average modulus of elasticity over the entire rigid bus bar body portion, in other examples, just a section of the first flexible bus bar body portion may have a modulus of elasticity that is lower than a section of the rigid bus bar body portion. The modulus of elasticity of the first flexible bus bar body portion may be lower than the modulus of elasticity of the rigid bus bar body portion in any manner as described in detail above in relation to the first flexible tab and/or second flexible tab compared to the rigid bus bar body portion. This may include differences in thickness, differences in materials, differences in manufacturing processes, a combination of these differences, etc.

The first flexible body portion may be of any shape, including having a first edge 332 extending form the interface, and a second edge 334 extending from the interface in parallel spaced relation to the first edge. Alternatively, the first edge and second edge may converge or taper toward one another, extend away or taper away from one another, have plural sections with one section converging while another section extends away from the other, etc. The first edge and second edge may terminate in a lateral edge 336 transverse to the first edge and second edge. Alternatively, the first edge and second edge may terminate in an arcuate surface.

The first flexible body portion my also include a terminal 338. The terminal may include threads 340 such that as a fastener is threaded through the terminal, the first flexible body portion may flex to facilitate connection between a first electronic device and the bus bar. In one example, the opening includes a conductive material to provide a conductive connection and first conductive pathway through the bus bar and an electronic device.

In another example, a male threaded bushing may be provided that may be received by the threads of the terminal. Then as the male threaded bushing screws into the terminal, the male threaded bushing moves toward the electrical device until engaging the electrical device to provide a conductive pathway. In this manner, the male threaded busing moves in relation to the bus bar and electrical device to account for tolerance differences. The fastener may then be disposed through the male threaded bushing to secure the bus bar to the electrical device. While the male threaded bushing is described in relation to a terminal of a flexible body portion, in another example the male threaded bushing may be provided for a terminal of bus bar that does not have flexible body portions, and instead the bus bar is rigid. In the example, the male threaded busing is the only mechanism for addressing tolerance differences between the bus bar and the electrical device.

The rigid bus bar body portion may also include a second opening 342 similar to the first opening. Specifically, the second opening may be generally rectangular in shape and has a perimeter that includes a first side edge 344 facing and in parallel spaced relation to a second side edge 346. Each of the first side edge and second side edge terminate is a third side edge 348 that extends transverse of the first side edge and second side edge. Opposite of the third side edge is a fourth side edge 349 that is parallel to the third side edge.

The bus bar may also include a second flexible bus bar body portion 350 that may extend from the fourth side edge into the second opening. In an example, the second flexible bus bar body portion may be similar to the first flexible bus bar body portion and is configured to couple to a gate of an IGBT. Additionally, the second flexible bus bar body portion may have the same modulus of elasticity as the first flexible bus bar body portion. In particular, the second flexible bus bar body portion may extend from an interface 352 with the rigid bus bar body portion at the fourth side edge into the first opening. Alternatively, the rigid bus bar body portion comprises a first layer having a first thickness and a second layer having a second thickness with the second flexible bus bar body portion on only one of either the first layer or second layer.

A gap 354 may extend around the periphery 356 of the second flexible bus bar body portion to space the second flexible bus bar body portion from the rigid bus bar body portion. The second flexible bus bar body portion may have a modulus of elasticity that is lower than modulus of elasticity of the rigid bus bar body portion. In particular, the modulus of elasticity of the second flexible bus bar body portion may be lower than the modulus of elasticity of the rigid bus bar body portion in any manner as described in detail above in relation to the first flexible tab and/or second flexible tab compared to the rigid bus bar body portion. This may include differences in thickness, differences in materials, differences in manufacturing processes, a combination of these differences, etc.

The second flexible bus bar body portion may be of any shape, including having a first edge 358 extending form the interface, and a second edge 360 extending from the interface in parallel spaced relation to the first edge. Alternatively, the first edge and second edge may converge or taper toward one another, extend or taper away from one another, have plural sections with one section converging while another section extends away from the other, etc. The first edge and second edge may terminate in a lateral edge 362 transverse to the first edge and second edge. Alternatively, the first edge and second edge may terminate in an arcuate surface.

The second flexible body portion my also include a terminal 364. The terminal may include threads 366 such that as a fastener is threaded through the terminal, the second flexible body portion may flex to facilitate connection between the first electronic device and the bus bar. In one example, the opening includes a conductive material to provide a conductive connection and second conductive pathway through the bus bar and an electronic device.

The bus bar may optionally include additional flexible bus bar body portions to provide additional electrical pathways for current to pass. The additional flexible bus bar body portions may include a third flexible bus bar body portion 368 and a fourth flexible bus bar body portion 370. Each may be of size, shape, positions, and/or formed as described in relation to the first flexible bus bar body portion and second flexible bus bar body portion. Each of the third flexible bus bar body portion 368 and fourth flexible bus bar body portion 370 may have a terminal 369, and 371 respectfully. In one example, the terminals of the third and fourth flexible bus bar body portions couple with an IGBT.

In the example of FIG. 3 the first flexible bus bar body portion may be aligned with the second bus bar body portion while the first flexible bus bar body portion may be in side-by-side relation with the third flexible bus bar body portion. Additionally, the third flexible bus bar body portion may be aligned with the fourth bus bar body portion while the fourth bus bar body portion may be in side-by-side relation to the second flexible bus bar body portion.

In the example bus bar of FIG. 3, the first flexible bus bar body portion and second flexible body portion form a first conductive pathway from the bus bar to an electronic device while the third flexible bus bar body portion and fourth flexible bus bar body portion form a second conductive pathway between the bus bar and the electronic device. In one example, the first flexible bus bar body portion and second flexible bus bar body portion may be positive terminals while the third flexible bus bar body portion, and fourth flexible bus bar body portion may be negative terminals.

A creep barrier 372 may be disposed between the positive terminals (first flexible bus bar body portion and the second flexible body portion) and the negative terminals (third flexible body portion and fourth flexible body portion). In particular, the creep barrier functions to prevent electrical creep and shorting between the terminals during operation. Specifically, electrical creep, or electrical tracking, is the undesired flow of current between positive and negative terminals that may in some examples cause shorting at an electrical coupling.

In other embodiments, the first flexible bus bar body portion may be at an angle compared to the second flexible bus bar body portion, third flexible bus bar body portion, and/or fourth flexible bus bar body portion. Alternatively, the flexible bus bar body portions may be aligned with one another, at right angles to one another, spaced in parallel with one another, etc. Specifically, the plural bus bar flexible body portions may be arranged, and oriented to one another in any manner. To this end, the direction of flow of the electrical pathways produce different inductance values, electrical fields, etc., and the plural bus bar flexible body portions may be arranged accordingly.

Figure 4:
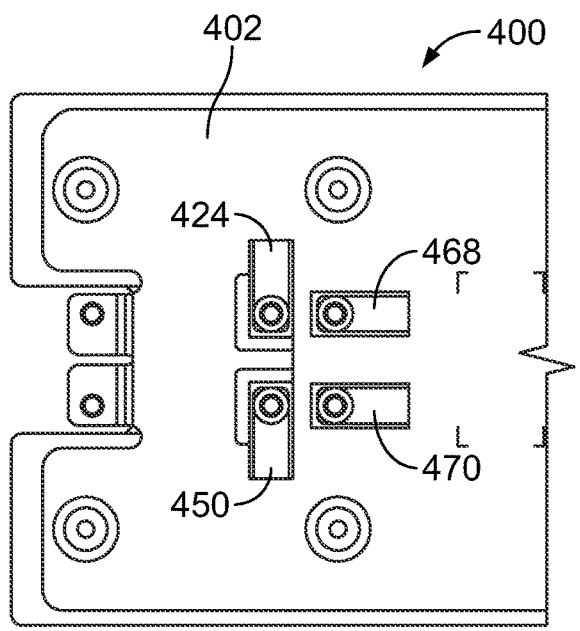
FIG. 4 illustrates a perspective view of a bus bar.
Figure 5:
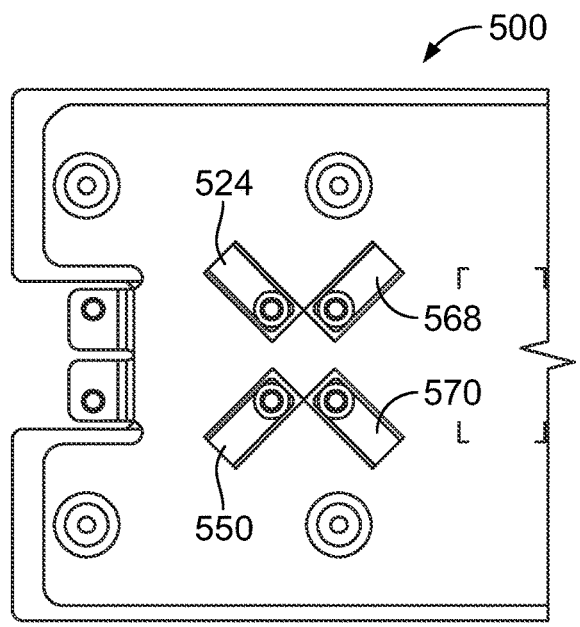
FIG. 5 illustrates a perspective view of a bus bar.
Figure 6:
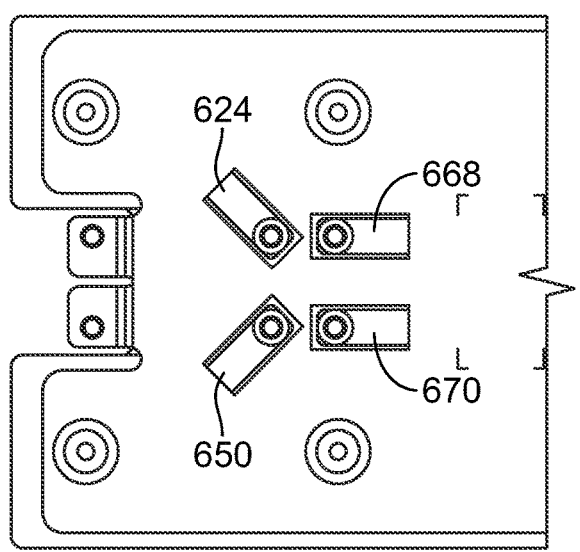
FIG. 6 illustrates a perspective view of a bus bar.

FIGS. 4 through 6 illustrate example bus bars 400, 500, and 600 respectfully that illustrate different example arrangements of the flexible bus bar body portions. Each arrangement results in a different inductance and current density, but is contemplated by this disclosure. For simplicity of explanation, only the rigid bus bar body portion and flexible bus bar body portions will be discussed. Still, the first flexible tab, second flexible tab, and flexible bus bar body portions may have a modulus of elasticity that may be lower than the modulus of elasticity of the rigid bus bar body portion in any manner as described in detail above in relation to the first flexible tab and/or second flexible tab compared to the rigid bus bar body portion as described in relation to FIG. 3 above. This may include differences in thickness, differences in materials, differences in manufacturing processes, a combination of these differences, etc.

FIG. 4 illustrates an example bus bar 400. In one example, the bus bar of FIG. 4 may be the bus bar as illustrated in FIGS. 1 and 2. The bus bar of FIG. 4 may have a rigid bus bar body portion 402 with the first flexible bus bar body portion 424 aligned with the second flexible bus bar body portion 450.

In the example bus bar of FIG. 4, the first flexible bus bar body portion and second flexible body portion form a first conductive pathway from the bus bar to an electronic device while the third flexible bus bar body portion and fourth flexible bus bar body portion form a second conductive pathway between the bus bar and the electronic device. In one example, the first flexible bus bar body portion and second flexible bus bar body portion may be a positive terminal. The first flexible bus bar body portion meanwhile also may extend perpendicular to the third flexible bus bar body portion 468. The fourth flexible bus bar body portion 470 may extend parallel to the third flexible bus bar body portion and perpendicular to the second flexible bus bar body portion. In one example the third flexible bus bar body portion, and fourth flexible bus bar body portion may be a negative terminal. In this position inductance may be improved compared to the examples of FIGS. 5 and 6, but current density may be improved compared to the examples of FIGS. 5 and 6.

FIG. 5 illustrates an example bus bar 500. In one example, the bus bar of FIG. 5 may be the bus bar as illustrated in FIGS. 1 and 2. The bus bar of FIG. 5 may have a rigid bus bar body portion 502 with the first flexible bus bar body portion 524 angled with the second flexible bus bar body portion 550.

In the example bus bar of FIG. 5, the first flexible bus bar body portion and second flexible body portion form a first conductive pathway from the bus bar to an electronic device while the third flexible bus bar body portion and fourth flexible bus bar body portion form a second conductive pathway between the bus bar and the electronic device. In one example, the first flexible bus bar body portion and second flexible bus bar body portion may be a positive terminal. The first flexible bus bar body portion meanwhile also may align with the third flexible bus bar body portion 568. The fourth flexible bus bar body portion 570 may align with the second flexible bus bar body portion while be angle with the third flexible bus bar body portion. In one example the third flexible bus bar body portion, and fourth flexible bus bar body portion may be a negative terminal.

FIG. 6 illustrates an example bus bar 600. In one example, the bus bar of FIG. 6 may be the bus bar as illustrated in FIGS. 1 and 2. The bus bar of FIG. 6 may have a rigid bus bar body portion 602 with the first flexible bus bar body portion 624 angled with the second flexible bus bar body portion 650.

In the example bus bar of FIG. 6, the first flexible bus bar body portion and second flexible body portion form a first conductive pathway from the bus bar to an electronic device while the third flexible bus bar body portion and fourth flexible bus bar body portion form a second conductive pathway between the bus bar and the electronic device. In one example, the first flexible bus bar body portion and second flexible bus bar body portion may be a positive terminal. The first flexible bus bar body portion meanwhile also may be at an angle with the third flexible bus bar body portion 668. The fourth flexible bus bar body portion 670 may be at an angle with the second flexible bus bar body portion while be in a parallel side-by-side relation to the third flexible bus bar body portion. In one example the third flexible bus bar body portion, and fourth flexible bus bar body portion may be a negative terminal. In the position of FIG. 6 the current density may be greater than the arrangements of FIGS. 4-5, but the inductance may not be as good as the arrangement of FIG. 4.

Figure 7:
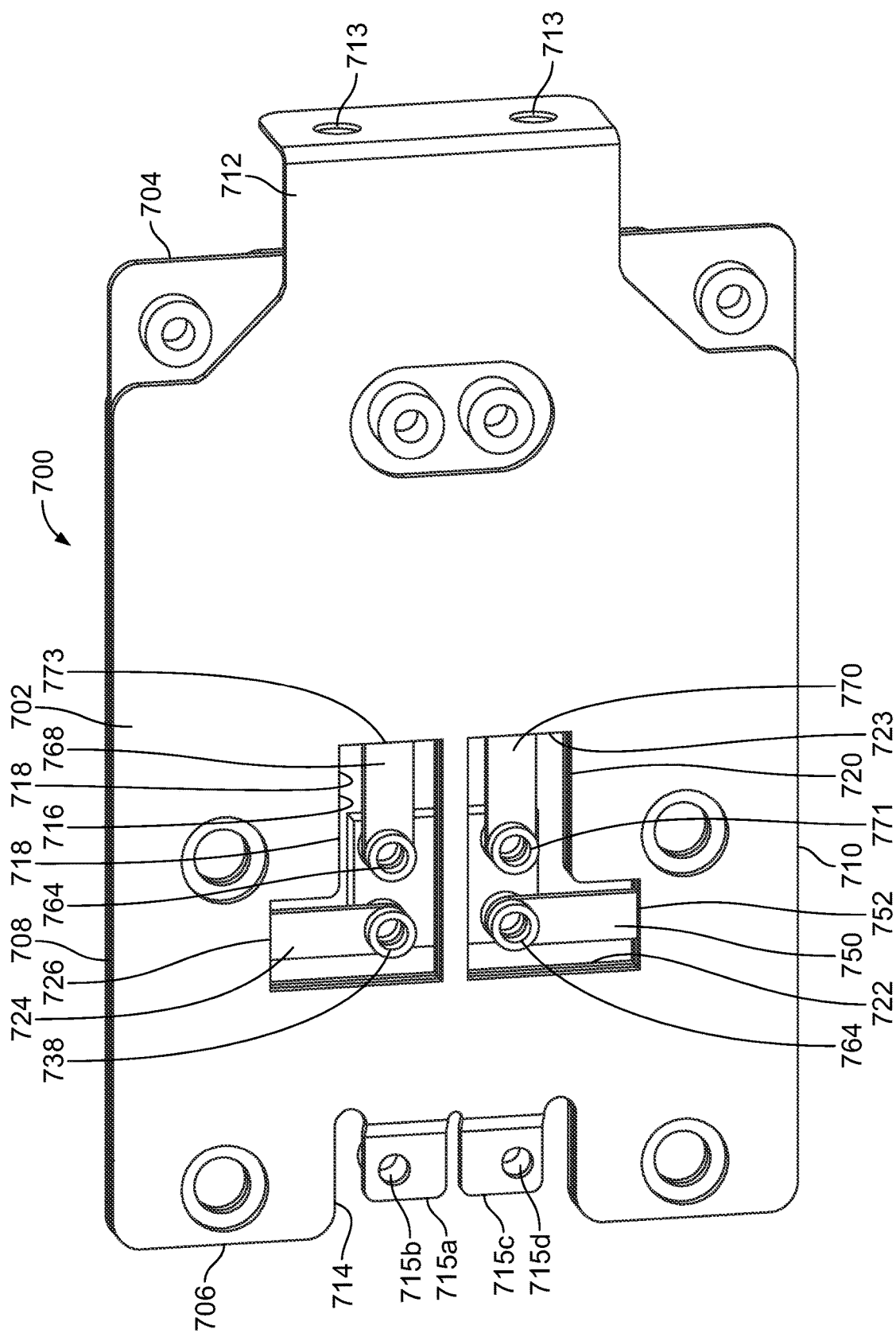
FIG. 7 illustrates a perspective view of a bus bar.

FIG. 7 illustrates another example bus bar 700. In one example, the bus bar of FIG. 7 is the bus bar as illustrated in FIGS. 1 and 2. In the example of FIG. 7, The bus bar may include a rigid bus bar body portion 702 that in an example is generally rectangular having a front edge 704, back edge 706, a first side edge 708, and a second side edge 710. The bus bar may be of one piece construction, or may be formed from layered bus bar sections that are secured together. At the front edge a first coupling member 712 extends outwardly and transverse to the rigid bus bar body portion and includes terminals 713. In one example the terminals may be configured to couple to a drain of an IGBT.

At the back edge a coupling notch 714 is provided. The coupling notch includes a first flexible tab 715a having a first terminal 715b in side-by-side spaced relation with a second flexible tab 715c having a second terminal 715d for coupling to an electronic device. In one example, each terminal may receive and electrically couple to a source of an IGBT. The first flexible tab and second flexible tab may each be coupled through brazing. In one example, the first flexible tab and second flexible tab may have a modulus of elasticity that is lower than modulus of elasticity of the rigid bus bar body portion. The modulus of elasticity of the first flexible tab and second flexible tab may be lower than the modulus of elasticity of the rigid bus bar body portion in any manner as described in detail above in relation to the first flexible tab and/or second flexible tab compared to the rigid bus bar body portion of FIG. 3. This may include differences in thickness, differences in materials, differences in manufacturing processes, a combination of these differences, etc.

The rigid bus bar body portion may also include a body opening 716. The opening is generally may be T-shape and has a perimeter that includes a first side edge 718 facing and in parallel spaced relation to a second side edge 720. Each of the first side edge and second side edge terminate in a third side edge 722 that extends transverse of the first side edge and second side edge. Opposite of the third side edge is a fourth side edge 723 that is parallel to the third side edge.

A first flexible bus bar body portion 724 extends from the first side edge within the opening. In one example, the first flexible bus bar body portion is configured to couple to a gate of an IGBT. The first flexible bus bar body portion extends from a first interface 726 with the rigid bus bar body portion at the third side edge into the opening. In one example, the interface is the only section of the first flexible bus bar body portion coupled with the rigid bus bar body portion. In one example, the interface with the rigid bus bar body portion that has a shorter length along the interface than an edge of the flexible bus bar body portion extending from the interface.

The first flexible bus bar body portion has a modulus of elasticity that is lower than the modulus of elasticity of the rigid bus bar body portion. In one example, the spring constant, or Young's modulus of elasticity under Hooke's law, of the first flexible bus bar body portion is 110 MPa, or $1.6*10^4$ lbs/in$^2$. Comparatively, previous bus bar body portions that are not considered flexible have a modulus of elasticity of approximately 1650 MPa, or $2.4*10^5$ lbs/in$^2$. In another example, the rigid bus bar body portion has a modulus of elasticity of greater than 1380 MPa, or $2.0*10^5$ lbs/in$^2$. In another example the modulus of elasticity of the first flexible bus bar body portion is less than 345 MPa, or $5*10^4$ lbs/in$^2$. In yet another example the modulus of elasticity of the flexible bus bar body portion is at least ten times less than the modulus of elasticity of the rigid bus bar body portion. In yet another example, the modulus of elasticity of the flexible bus bar boy portion is in a range between 70 MPa, or $1*10^4$ lbs/in$^2$ and 345 MPa, or $5*10^4$ lbs/in$^2$.

The modulus of elasticity of the first flexible bus bar body portion may be lower than the modulus of elasticity of the rigid bus bar body portion in any manner as described in detail above in relation to the first flexible tab and/or second flexible tab compared to the rigid bus bar body portion of FIG. 3. This may include differences in thickness, differences in materials, differences in manufacturing processes, a combination of these differences, etc.

The first flexible body portion my also include a terminal 738. The terminal may include threads such that as a fastener is threaded through the terminal, the first flexible body portion may flex to facilitate connection between the first electronic device and the bus bar. In one example, the opening includes a conductive material to provide a conductive connection and first conductive pathway through the bus bar and an electronic device.

The bus bar may also include a second flexible bus bar body portion 750 that extends from the second side edge into the opening. In an example, the second flexible bus bar body portion may be similar to the first flexible bus bar body portion and may be configured to couple to a gate of an IGBT. In particular, the second flexible bus bar body portion may extend from a second interface 752 with the rigid bus bar body portion at the fourth side edge into the opening. The second flexible bus bar body portion may have a modulus of elasticity that is lower than modulus of elasticity of the rigid bus bar body portion. The modulus of elasticity of the second flexible bus bar body portion may be lower than the modulus of elasticity of the rigid bus bar body portion in any manner as described in detail above in relation to the first flexible tab and/or second flexible tab compared to the rigid bus bar body portion of FIG. 3. This may include differences in thickness, differences in materials, differences in manufacturing processes, a combination of these differences, etc.

The second flexible body portion my also include a terminal 764. The terminal may include threads such that as a fastener is threaded through the terminal, the second flexible body portion may flex to facilitate connection between the first electronic device and the bus bar. In one example, the opening includes a conductive material to provide a conductive connection and first conductive pathway through the bus bar and an electronic device. The second flexible body portion may have any of the characteristics, features, etc. of the first flexible body portion. In one example, the first flexible bus bar body portion and second flexible bus bar body portion may be a positive terminal through which the first conductive pathway of current flows.

The rigid bus bar body portion may optionally include additional flexible bus bar body portions to provide additional conductive pathways for current to pass. The additional flexible bus bar body portions include a third flexible bus bar body portion 768 and a fourth flexible bus bar body portion 770. Each may have any of the characteristics, features, or be formed as described in relation to the first flexible tab and second flexible tab of FIG. 3 etc. as described in relation to the first flexible bus bar body portion. In the example of FIG. 7, the third flexible bus bar body portion may extend from the fourth side edge within the opening. The third flexible bus bar body portion may include a terminal 769. In one example, the terminal of the third flexible bus bar body portion is configured to couple to an IGBT. The third flexible bus bar body portion may extend from an interface 773 with the rigid bus bar body portion at the fourth side edge into the opening. In one example, the interface is the only section of the third flexible bus bar body portion coupled with the rigid bus bar body portion. The third flexible bus bar body portion may be generally rectangular and extend within the opening perpendicular to the first flexible bus bar body portion and perpendicular to the second flexible bus bar body portion.

The fourth flexible bus bar body portion may also extend from the fourth side edge within the opening. The fourth flexible bus bar body portion may include a terminal 771. In one example, the terminal of the fourth flexible bus bar body portion is configured to couple to an IGBT. The fourth flexible bus bar body portion may extend from the interface with the rigid bus bar body portion at the fourth side edge into the opening. In one example, the interface is the only section of the fourth flexible bus bar body portion coupled with the rigid bus bar body portion. The fourth flexible bus bar body portion may be generally rectangular and extend within the opening perpendicular to the first flexible bus bar body portion and perpendicular to the second flexible bus bar body portion. The fourth flexible bus bar body portion may extend in parallel side-by-side relation to the third flexible bus bar body portion. In one example, the third flexible bus bar body portion, and fourth flexible bus bar body portion may form a second conductive pathway that may be a negative terminal. In the example of FIG. 7, because the flexible bus bar body portions are placed in the opening, no material is disposed between the positive and negative terminals (the first and second flexible bus bar body portions, and the third and fourth flexible bus bar body portions). As a result, the material pathway between the negative and positive terminals is greatly increased, reducing, if not eliminating shorting from electrical creep. To this end, a need for a creep barrier is eliminated, simplifying manufacturing, and improving design flexibly that may be used to improve inductance.

Figure 8:
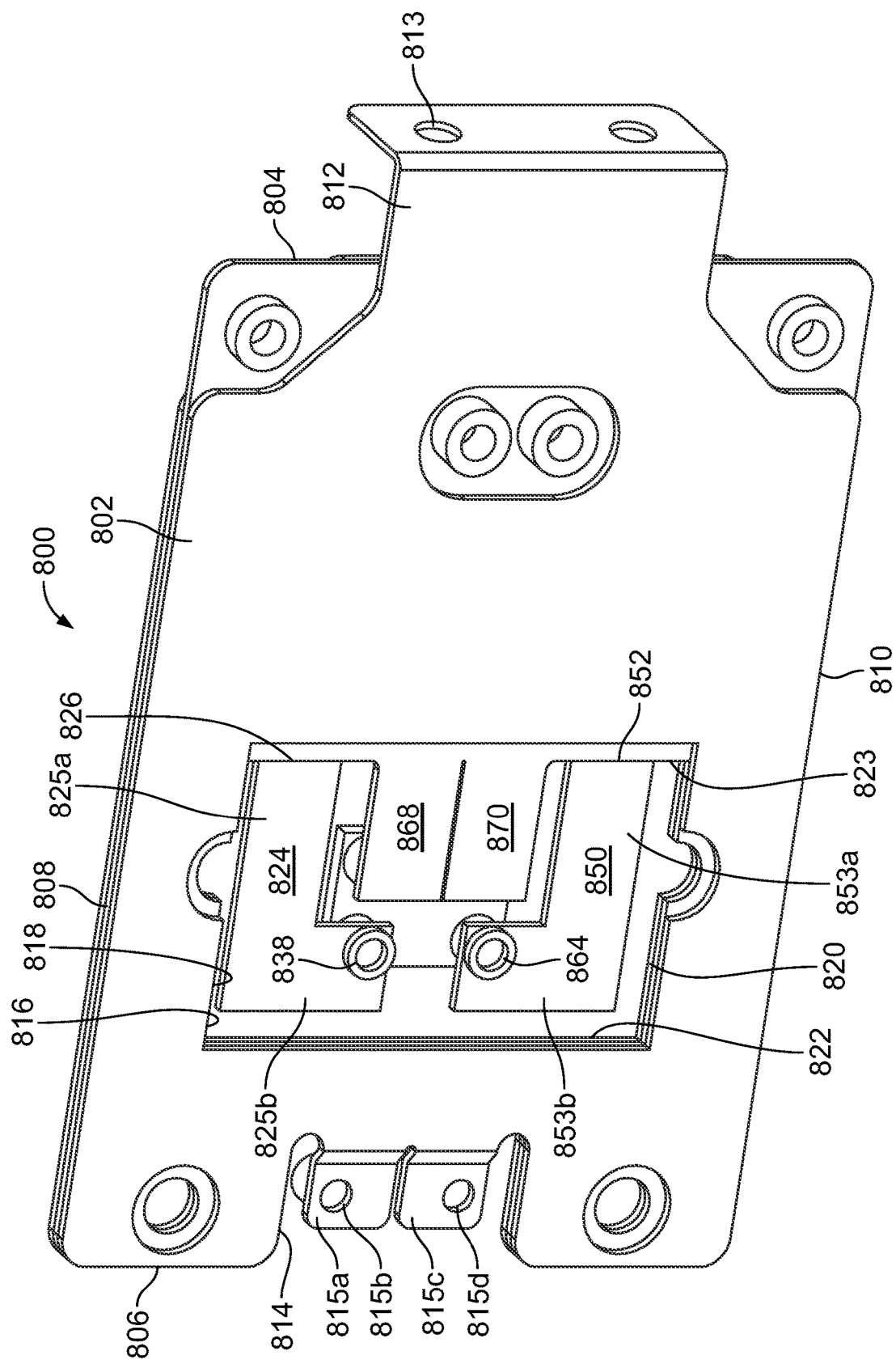
FIG. 8 illustrates a perspective view of a bus bar.

FIG. 8 illustrates another example embodiment of a bus bar 800. In one example, the bus bar of FIG. 8 is the bus bar of FIGS. 1 and 2. In the example of FIG. 8, The bus bar includes a rigid bus bar body portion 802 that in an example is generally rectangular having a front edge 804, back edge 806, a first side edge 808, and a second side edge 810. The bus bar may be of one piece construction, or may be formed from layered bus bar sections that are secured together. At the front edge a first coupling member 812 extends outwardly and transverse to the rigid bus bar body portion and includes terminals 813. In one example the terminals may be configured to couple to a drain of an IGBT.

At the back edge a coupling notch 814 is provided. The coupling notch includes a first flexible tab 815*a* having a first terminal 815*b* in side-by-side spaced relation with a second flexible tab 815*c* having a second terminal 815*d* for coupling to an electronic device. In one example, each terminal may receive and electrically couple to a source of an IGBT. The modulus of elasticity of the first flexible tab and/or second flexible tab may be lower than the modulus of elasticity of the rigid bus bar body portion in any manner as described in detail above in relation to the first flexible tab and/or second flexible tab compared to the rigid bus bar body portion of FIG. 3. This may include differences in thickness, differences in materials, differences in manufacturing processes, a combination of these differences, etc.

The rigid bus bar body portion may also include a body opening 816. The opening may be generally rectangular in shape and may have a perimeter that includes a first side edge 818 facing and in parallel spaced relation to a second side edge 820. Each of the first side edge and second side edge may terminate in a third side edge 822 that extends transverse of the first side edge and second side edge. Opposite of the third side edge is a fourth side edge 823 that may be parallel to the third side edge.

A first flexible bus bar body portion 824 extends from the fourth side edge within the opening. In one example, the first flexible bus bar body portion is configured to couple to a gate of an IGBT. The first flexible bus bar body portion extends from an interface 826 with the rigid bus bar body portion at the fourth side edge into the opening. In one example, the interface is the only section of the first flexible bus bar body portion coupled with the rigid bus bar body portion. The first flexible bus bar body portion is generally L-shaped including a vertical section 825*a* extending from the interface, and a horizontal section 825*b* extending from the end of the vertical section opposite from the interface. In one example, the interface with the rigid bus bar body portion that has a shorter length along the interface than an edge of the flexible bus bar body portion extending from the interface.

The modulus of elasticity of the first flexible bus bar body portion may be lower than the modulus of elasticity of the rigid bus bar body portion in any manner as described in detail above in relation to the first flexible tab and/or second flexible tab compared to the rigid bus bar body portion of FIG. 3. This may include differences in thickness, differences in materials, differences in manufacturing processes, a combination of these differences, etc.

The first flexible body portion my also include a terminal 838. The terminal may include threads such that as a fastener is threaded through the terminal, the first flexible body portion may flex to facilitate connection between the first electronic device and the bus bar. In one example, the opening includes a conductive material to provide a conductive connection and first conductive pathway through the bus bar and an electronic device.

The bus bar may also include a second flexible bus bar body portion 850 that extends from the fourth side edge into the opening. In an example, the second flexible bus bar body portion may be similar to the first flexible bus bar body portion and is configured to couple to a gate of an IGBT. In particular, the second flexible bus bar body portion extends from an interface 852 with the rigid bus bar body portion at the fourth side edge into the opening. The second flexible bus bar body portion may have a modulus of elasticity that is lower than modulus of elasticity of the rigid bus bar body portion.

The modulus of elasticity of the second flexible bus bar body portion may be lower than the modulus of elasticity of the rigid bus bar body portion in any manner as described in detail above in relation to the first flexible tab and/or second flexible tab compared to the rigid bus bar body portion of FIG. 3. This may include differences in thickness, differences in materials, differences in manufacturing processes, a combination of these differences, etc.

The second flexible bus bar body portion is generally L-shaped including a vertical section 853*a* extending from the interface, and a horizontal section 853*b* extending from the end of the vertical section opposite from the interface. The horizontal section of the second flexible bus bar body portion extends toward and aligns with the horizontal section of the first flexible bus bar body portion such that the distance between the horizontal sections is less than the distance between the vertical sections.

The second flexible body portion my also include a terminal 864 disposed therein. The terminal may include threads such that as a fastener is threaded through the terminal, the second flexible body portion may flex to facilitate connection between the first electronic device and the bus bar.

In the example bus bar of FIG. 8, the first flexible bus bar body portion and second flexible body portion form a first conductive pathway from the bus bar to an electronic device while the third flexible bus bar body portion and fourth flexible bus bar body portion form a second conductive pathway between the bus bar and the electronic device. In one example, the openings of the flexible bus bar body portions may include a conductive material to provide a conductive connection and first conductive pathway through the bus bar and an electronic device. In one example, the first flexible bus bar body portion and second flexible bus bar body portion may be a positive terminal.

The bus bar may optionally include additional flexible bus bar body portions to provide additional electrical pathways for current to pass. The additional flexible bus bar body portions may include a third flexible bus bar body portion 868 and a fourth flexible bus bar body portion 870. Each may have any of the characteristics, features, be formed etc. as described in relation to the first flexible bus bar body portion, or the first flexible tab and second flexible tab of FIG. 3.

In the example of FIG. 8, the third flexible bus bar body portion may extend from the fourth side edge within the opening. In one example, the third flexible bus bar body portion is configured to couple to an IGBT. The third flexible bus bar body portion may extend from the interface with the rigid bus bar body portion at the fourth side edge into the opening. In one example, the interface is the only section of the third flexible bus bar body portion coupled with the rigid bus bar body portion. The third flexible bus bar body portion may be generally rectangular and extend within the opening between the vertical section of the first flexible bus bar body portion and the vertical section of the second flexible bus bar body portion. In an example, the horizontal section of the first flexible bus bar body at least partially extend above the third flexible bus bar body portion.

The fourth flexible bus bar body portion may extend from the fourth side edge within the opening. In one example, the fourth flexible bus bar body portion may be configured to couple to an IGBT. The fourth flexible bus bar body portion may extend from the interface with the rigid bus bar body portion at the fourth side edge into the opening. In one example, the interface is the only section of the fourth flexible bus bar body portion coupled with the rigid bus bar body portion.

The fourth flexible bus bar body portion may be generally rectangular and extend within the opening between the vertical section of the first flexible bus bar body portion and the vertical section of the second flexible bus bar body portion. The fourth flexible bus bar body portion may extend in side-by-side relation to the third flexible bus bar body portion with a gap between the third flexible bus bar body portion and fourth flexible bus bar body portion being less than the gap between the third flexible bus bar body portion and the first flexible bus bar body portion, or the gap between the fourth flexible bus bar body portion and the second flexible bus bar body portion. In an example, the horizontal section of the second flexible bus bar body at least partially extend above the fourth flexible bus bar body portion. In one example, the third flexible bus bar body portion, and fourth flexible bus bar body portion may be a negative terminal. In the example of FIG. 8, because the flexible bus bar body portions are placed in the opening, no material is disposed between the positive and negative terminals (the first and second flexible bus bar body portions, and the third and fourth flexible bus bar body portions) in the opening. As a result, the material pathway between the negative and positive terminals is greatly increased, reducing, if not eliminating shorting from electrical creep. To this end, a need for a creep barrier is eliminated, simplifying manufacturing, and improving design flexibly that may be used to improve inductance.

By providing the arrangement of FIG. 8 a decrease in current density through the flexible bus bar body portions is reduced. The reduced current density results in less heat stresses and wear, providing a more robust coupling.

Figure 9:
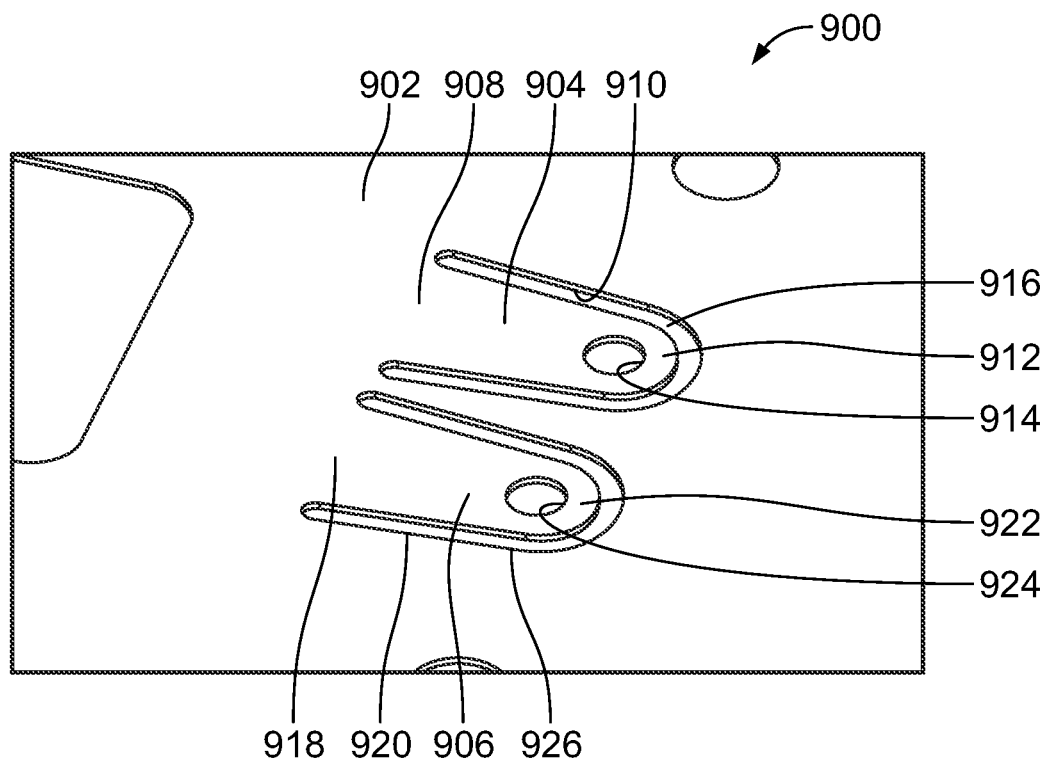
FIG. 9 illustrates a perspective view of a section of a bus bar.

FIG. 9 illustrates an example section of an example bus bar 900. The section of the bus bar includes a rigid bus bar body portion 902, a first flexible bus bar body portion 904, and a second flexible bus bar body portion 906. In the example of FIG. 9, the rigid bus bar body portion and the first flexible bus bar body portion, and second flexible bus bar body portion are of one-piece construction.

The first flexible bus bar body portion may extend from a first interface 908 between the rigid bus bar body portion and the first bus bar body portion into a first opening 910. From the first interface, the first flexible bus bar body portion may taper to a first arcuate end surface 912. A first terminal 914 may be disposed through the first flexible bus bar body portion at the first arcuate end surface. A first gap 916 may formed between the first flexible bus bar body portion and the rigid bus bar body portion.

The second flexible bus bar body portion similarly extends from a second interface 918 between the rigid bus bar body portion and the second bus bar body portion into a second opening 920. The second flexible bus bar body portion may extend in side-by-side relation to the first flexible bus bar body portion. From the second interface, the second flexible bus bar body portion may taper to a second arcuate end surface 922. A second terminal 924 may be disposed through the second flexible bus bar body portion at the second arcuate end surface. A second gap 926 may be formed between the first flexible bus bar body portion and the rigid bus bar body portion. In example embodiments where the flexible bus bar body portions are tapered, improved current density may be realized. Still, the modulus of elasticity of the flexible bus bar body portions may be the same as any described herein with regard to other embodiments.

Figure 10:
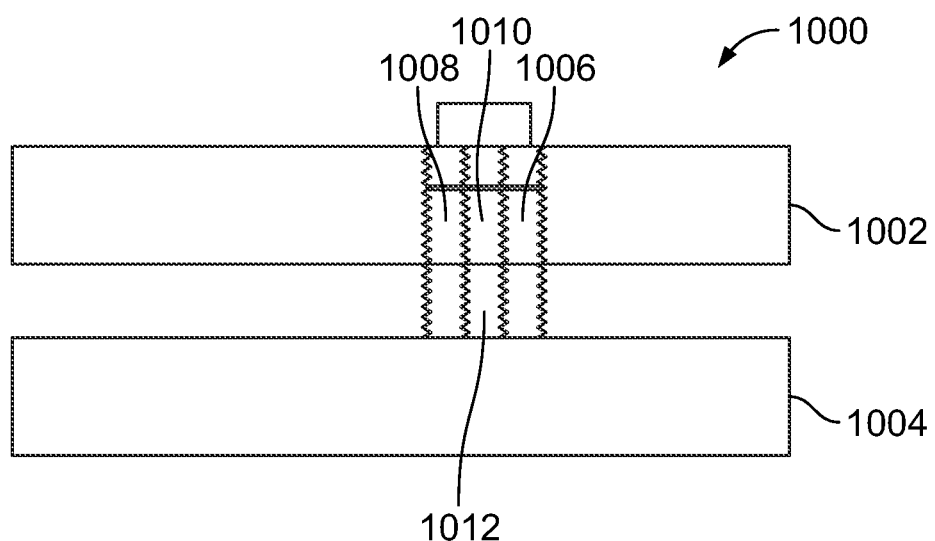
FIG. 10 illustrates a sectional view of an electrical system.

FIG. 10 illustrates an example electrical system 1000 that may include a rigid bus bar 1002 mechanically coupled to an electrical device 1004. In one example, the electrical device is an IGBT. In the example, a heat sink is not illustrated to facilitate explanation. The ridged bus bar may include a terminal 1006 that may include threads for receiving a male threaded bushing 1008 having an opening 1010 that similarly may include threads. When coupling the rigid bus to the electrical system, the male threaded bushing threadably moves towards and engages the electrical device to provide a conductive pathway between the rigid bus bar and electrical device. A fastener 1012 may then be disposed through the male threaded bushing to secure the rigid bus bar to the electrical device. In this manner, the male threaded busing moves in relation to the bus bar and electrical device to account for tolerance differences.

Figure 11:
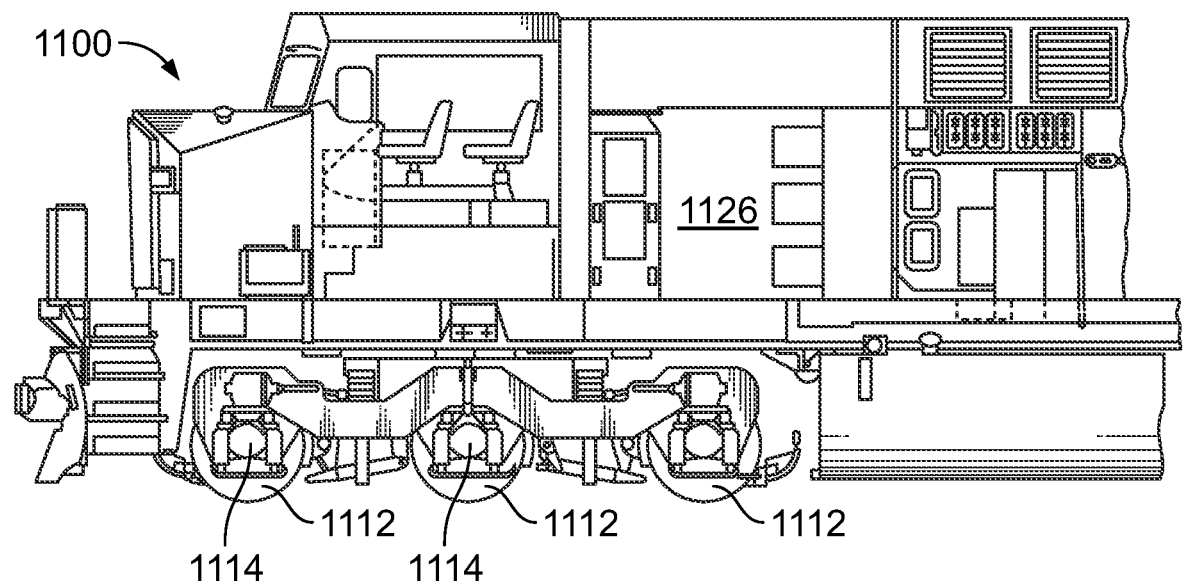
FIG. 11 illustrates a simplified, partial schematic representation of a vehicle.

Reference is first made to FIG. 11, which illustrates a simplified, partial cross-sectional view of an electric traction vehicle 1110 that may use any of the bus bars described herein. The traction vehicle may include traction systems wherein power is received from an external power generation source and distributed via a catenary or third rail, as well as to electric machinery that utilizes electric motors, more generally.

The vehicle of FIG. 11 includes a plurality of traction motors, not visible in the figure but located behind the drive wheels 1112 and coupled in driving relationship to axles 1114. The motors may be alternating current (AC) electric motors and the locomotive includes a plurality of electrical inverter circuits for controlling electrical power to the motors.

Figure 12:
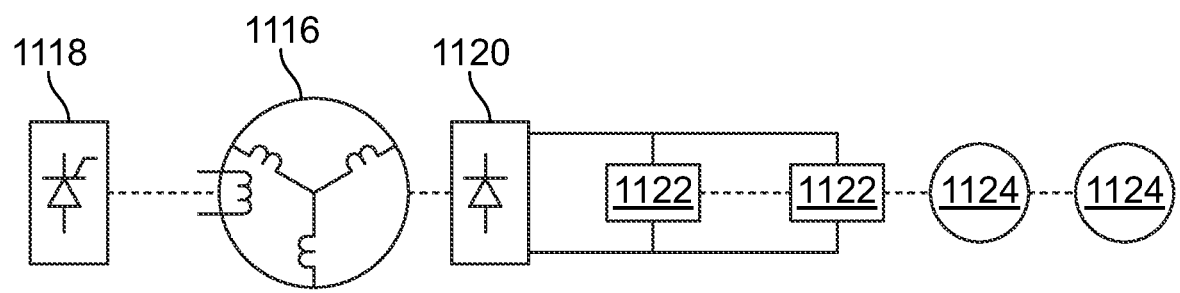
FIG. 12 illustrates a simplified schematic representation of a power circuit for a vehicle.

FIG. 12 illustrates a simplified schematic representation of an electrical traction system for vehicle including an alternator 1116 driven by an on-board internal combustion engine such as a diesel engine (not shown). Power output of the alternator may be regulated by field excitation control indicated by block 1118. Electrical power from alternator is rectified, block 1120, and coupled to inverters 1122. Inverters may use high power semiconductor switching devices such as IGBTs (as described above) or GTOs to convert the rectified power to variable frequency, variable amplitude power for application to AC motors 1124.

Referring again to FIG. 11, electrical power circuits are at least partially located in an inverter drive assembly compartment or envelope 1126. Within envelope, the high power semiconductor devices (not shown in FIG. 11) may be mounted to air cooled heat sinks.

Generally speaking, during operation, alternating current is fed to the inverter drive assembly from an alternator (not shown) via AC bus bars. Rectifiers are configured to convert the alternating current to direct current, which is then fed through to a horizontal, capacitor bus bar, and ultimately to DC link capacitors connected to the horizontal bus bar. The capacitors are configured to supply the direct current to inverter modules (not shown) that are mounted to a vertical bus bar which is, itself, connected to the horizontal, capacitor bus bar. The direct current is then inverted to AC power of controlled frequency and amplitude and supplied to the traction motors of the vehicle.

As illustrated by the example bus bars, the size, shape, position, location, material composition, manufacturing process, etc. of the flexible bus bar body portions may be varied depending on mechanical and electrical requirements of the bus bar. These requirements may include strength, tensile strength, elasticity, current density, inductance, or the like. Still, because of the flexibility of the flexible bus bar body portions coupling of the bus bar to an electrical device is facilitated, cracking is reduced, and overall performance of the bus bar is improved.

In one or more embodiment, a system may be provided that may include a rigid bus bar body portion having one or more first conductive pathways, and a flexible bus bar body portion extending from the rigid bus bar body portion and having a lower modulus of elasticity than the rigid bus bar body portion. The flexible bus bar body portion may include one or more second conductive pathways, and the one or more first conductive pathways and the one or more second conductive pathways may be configured to be conductively coupled with a first electronic device to form a conductive connection between the first electronic device and at least a second electronic device.

Optionally, the flexible bus bar body portion may be thinner than the rigid bus bar body portion.

Optionally, the flexible bus bar body portion may extend into an opening within the rigid bus bar body portion. In another aspect, the flexible bus bar body portion may include an interface with the rigid bus bar body portion that has a shorter length along the interface than an edge of the flexible bus bar body portion extending from the interface.

Optionally, the flexible bus bar body portion may include an interface with the rigid bus bar body portion, a first edge extending transverse to the interface, and a second edge extending transverse to the interface in a parallel spaced relation to the first edge, the first edge and the second edge terminating in a third edge extending between the first edge and second edge. In an aspect, the flexible bus bar body portion may include an arcuate surface.

Optionally, the flexible bus bar body portion may be a first flexible bus bar body portion, and the system may also include a second flexible bus bar body portion that extends parallel to the first flexible bus bar body portion.

Optionally, the flexible bus bar body portion may include an opening configured to receive a fastener for mechanically coupling the rigid bus bar body portion to an insulated-gate bipolar transistor.

Optionally, the flexible bus bar body portion may include a first flexible bus bar body portion and a second flexible bus bar body portion spaced from the first flexible bus bar body portion with a creep barrier between the first flexible bus bar body portion and the second flexible bus bar body portion.

Optionally, the system may also include a flexible, brazed connection section coupled to the rigid bus bar body portion.

In one or more embodiments, a system may be provided that may include a first rigid bus bar body portion, and a first flexible bus bar body portion extending from the first rigid bus bar body portion and having a lower modulus of elasticity than the first rigid bus bar body portion. The system may also include a second rigid bus bar body portion mechanically coupled to the first rigid bus bar body portion, and a second flexible bus bar body portion extending from the second rigid bus bar body portion and having a lower modulus of elasticity than the second rigid bus bar body portion.

Optionally, the first flexible bus bar body portion may have a thickness that is less than a thickness of the first rigid bus bar body portion, or the second flexible bus bar body portion may have a thickness that is less than a thickness of the second rigid bus bar body portion.

Optionally, the first flexible bus bar body portion may be aligned with the second flexible bus bar body portion.

Optionally, the system may also include a flexible connection section coupled to the first rigid bus bar body portion that may have a lower modulus of elasticity than the first rigid bus bar body portion.

Optionally, first flexible bus bar body portion may not have an arcuate surface, and wherein the second flexible bus bar body portion may have an arcuate surface.

Optionally, the system may also include an insulated-gate bipolar transistor mechanically coupled to the first flexible bus bar body portion to provide a first conductive pathway between the first rigid bus bar body portion and the insulated-gate bipolar transistor. The insulated-gate bipolar transistor may also be mechanically coupled to the second flexible bus bar body portion to provide a second conductive pathway between the second rigid bus bar body portion and the insulated-gate bipolar transistor.

Optionally, the system may also include a heat sink engaging the insulated-gate bipolar transistor and mechanically coupled to the first rigid bus bar body portion and the second rigid bus bar body portion.

In one or more embodiment, a system may be provided that may include a rigid bus bar body portion, and at least one flexible bus bar body portion extending from the rigid bus bar body portion and having a lower modulus of elasticity than the rigid bus bar body portion. The system may also include an insulated-gate bipolar transistor mechanically coupled to the rigid bus bar body portion when coupled to the at least one flexible bus bar body portion to provide a conductive pathway between the insulated-gate bipolar transistor and the rigid bus bar body portion.

Optionally, the system may also include a heat sink engaging the insulated-gate bipolar transistor and mechanically coupled to the rigid bus bar body portion.

Optionally, the at least one flexible bus bar body portion may include a threaded opening configured to receive a fastener that pulls the insulated-gate bipolar transistor mechanically toward the rigid bus bar body portion.

The singular forms "a", "an", and "the" include plural references unless the context clearly dictates otherwise. "Optional" or "optionally" means that the subsequently described event or circumstance may or may not occur, and that the description may include instances where the event occurs and instances where it does not. Approximating language, as used herein throughout the specification and claims, may be applied to modify any quantitative representation that could permissibly vary without resulting in a change in the basic function to which it may be related. Accordingly, a value modified by a term or terms, such as "about," "substantially," and "approximately," may be not to be limited to the precise value specified. In at least some instances, the approximating language may correspond to the precision of an instrument for measuring the value. Here and throughout the specification and claims, range limitations may be combined and/or interchanged, such ranges may be identified and include all the sub-ranges contained therein unless context or language indicates otherwise.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A system comprising:
a rigid bus bar body portion having one or more first conductive pathways; and
a flexible bus bar body portion extending from the rigid bus bar body portion and having a lower modulus of elasticity than the rigid bus bar body portion, the flexible bus bar body portion including one or more second conductive pathways, the one or more first conductive pathways and the one or more second conductive pathways configured to be conductively coupled with a first electronic device to form a conductive connection between the first electronic device and at least a second electronic device;
wherein the flexible bus bar body portion includes an opening configured to receive a fastener for mechanically coupling the rigid bus bar body portion to an insulated-gate bipolar transistor.

2. The system of claim 1, wherein the flexible bus bar body portion is thinner than the rigid bus bar body portion.

3. The system of claim 1, wherein the flexible bus bar body portion extends into an opening within the rigid bus bar body portion.

4. The system of claim 1, wherein the flexible bus bar body portion includes an interface with the rigid bus bar body portion that has a shorter length along the interface than an edge of the flexible bus bar body portion extending from the interface.

5. The system of claim 1, wherein the flexible bus bar body portion includes an interface with the rigid bus bar body portion, a first edge extending transverse to the interface, and a second edge extending transverse to the interface in a parallel spaced relation to the first edge, the first edge and the second edge terminating in a third edge extending between the first edge and the second edge.

6. The system of claim 1, wherein the flexible bus bar body portion includes an arcuate surface.

7. The system of claim 1, wherein the flexible bus bar body portion is a first flexible bus bar body portion, and the system further comprises a second flexible bus bar body portion that extends parallel to the first flexible bus bar body portion.

8. The system of claim 1, wherein the flexible bus bar body portion includes a first flexible bus bar body portion and a second flexible bus bar body portion spaced from the first flexible bus bar body portion with a creep barrier between the first flexible bus bar body portion and the second flexible bus bar body portion.

9. The system of claim 1, wherein the rigid bus bar body portion and the flexible bus bar body portion are coupled via brazing.

10. A system comprising:
a first rigid bus bar body portion;

a first flexible bus bar body portion extending from the first rigid bus bar body portion and having a lower modulus of elasticity than the first rigid bus bar body portion;

a second rigid bus bar body portion mechanically coupled to the first rigid bus bar body portion; and a second flexible bus bar body portion extending from the second rigid bus bar body portion and having a lower modulus of elasticity than the second rigid bus bar body portion;

wherein the first flexible bus bar body portion is spaced from the second flexible bus bar body portion with a creep barrier between the first flexible bus bar body portion and the second flexible bus bar body portion.

11. The system of claim 10, wherein the first flexible bus bar body portion has a thickness that is less than a thickness of the first rigid bus bar body portion, or the second flexible bus bar body portion has a thickness that is less than a thickness of the second rigid bus bar body portion.

12. The system of claim 10, wherein the first flexible bus bar body portion is aligned with the second flexible bus bar body portion.

13. The system of claim 10, further comprising a flexible connection section coupled to the first rigid bus bar body portion and having a lower modulus of elasticity than the first rigid bus bar body portion.

14. The system of claim 10, wherein the second flexible bus bar body portion has an arcuate surface.

15. The system of claim 10, further comprising an insulated-gate bipolar transistor mechanically coupled to the first flexible bus bar body portion to provide a first conductive pathway between the first rigid bus bar body portion and the insulated-gate bipolar transistor, the insulated-gate bipolar transistor mechanically coupled to the second flexible bus bar body portion to provide a second conductive pathway between the second rigid bus bar body portion and the insulated-gate bipolar transistor.

16. The system of claim 15, further comprising a heat sink engaging the insulated-gate bipolar transistor and mechanically coupled to the first rigid bus bar body portion and the second rigid bus bar body portion.

17. A system comprising:

a rigid bus bar body portion;

a threaded terminal disposed through a flexible bus bar body portion extending from the rigid bus bar body portion and having a lower modulus of elasticity than the rigid bus bar body portion, the threaded terminal configured to receive a male threaded bushing configured to be movable within the threaded terminal to engage an insulated-gate bipolar transistor portion; and the insulated-gate bipolar transistor portion mechanically coupled to the rigid bus bar body portion to provide a conductive pathway between the insulated-gate bipolar transistor portion and the rigid bus bar body portion through the male threaded bushing;

wherein the rigid bus bar body portion and the flexible bus bar body portion are coupled via brazing.

18. The system of claim 17, further comprising a heat sink engaging the insulated-gate bipolar transistor portion and mechanically coupled to the rigid bus bar body portion.

19. The system of claim 17, wherein a fastener is disposed through the male threaded bushing to mechanically couple the rigid bus bar body portion to the insulated-gate bipolar transistor portion.

20. The system of claim 10, wherein the first rigid bus bar body portion and the first flexible bus bar body portion are coupled via brazing.

* * * * *